Oct. 12, 1965 R. J. ANDRES ETAL 3,211,594

SEMICONDUCTOR DEVICE MANUFACTURE

Filed Dec. 19, 1961

INVENTORS.
RAYMOND J. ANDRES,
EDWIN MATOVICH,
BY Charles S. Haughey
ATTORNEY.

United States Patent Office 3,211,594

Patented Oct. 12, 1965

3,211,594

SEMICONDUCTOR DEVICE MANUFACTURE

Raymond J. Andres, Newport Beach, and Edwin Matovich, Costa Mesa, Calif., assignors to Hughes Aircraft Company, Culver City, Calif., a corporation of Delaware Filed Dec. 19, 1961, Ser. No. 160,436
16 Claims. (Cl. 148—178)

This invention relates to the manufacture of semiconductor devices, and is best illustrated by the post-alloy diffused transistor.

It is generally known that semiconductor materials have a high affinity for many metals, and that alloying steps in processing semiconductor materials are often critical where penetration of alloy material, such as a bonding alloy or an electrical conductivity type determining dopant, is to be closely controlled or limited in depth; and it is also well known that switching transistor devices are considerably improved in switching speed where geometrical dimensions are reduced. In switching transistors the switching speeds are a function of the delay times, which in turn may be attributed to three primary sources: (1) charging the capacitors of the emitter to base and the base to collector junctions, (2) storage of charge into the volume of the collector; and (3) transport time of carriers in the base region. Switching speeds of the order of $10^{-7}$ to $10^{-8}$ seconds or faster are attainable when base transit times are reduced to the order of $10^{-8}$ to $10^{-9}$ seconds, and become negligible in the total time.

In attempts to increase switching speeds and oscillator frequencies, very small devices are sought to reduce the first two sources of delay times. In such dimensions processing is complicated by the change in relationship of various effects on small alloy or dopant metal pieces and thin films. For example, surface tension and electrostatic potential are far more important to the handling of metal spheres of 0.005 inch diameter than is gravity; and in rings of less than 0.025 inch inside diameter, such forces overcome known jigging procedures to retain their shape for alloying with semiconductor material pieces, generally referred to as dice. Such problems make control of alloy penetration in transistor manufacture, as in emitter junction formation, very difficult. When a predetermined base region thickness in a semiconductor crystal die requires controlled dopant penetration to produce an emitter alloy regrown region with a fixed remaining base width, the use of alloy spheres in such small size ranges becomes commercially impractical.

Sequential formation of alloy-regrown base and emitter regions within narrow dimensional tolerances in such small devices is virtually impossible, since tolerances of the first step must be added to tolerances of the second step. If the base region thickness can be held to less than about 5 microns, and preferably between about 0.5 and 3 microns, the third primary source of delay time, transport time across the base region, becomes negligible. A base region thickness of one micron has been found to be a preferred thickness.

When sequential alloy regrown base and emitter regions are produced with the desired base thickness of about 0.5 to 3 microns, low alphas of the order of 0.85 or less are produced. If diffused-base regions are utilized to provide an aiding field in the base region, alphas of 0.98 are obtainable, but dimensional and fabrication problems remain.

Even if handling problems in making very small emitter and base regions required for very fast switching times, of the order of $10^{-7}$ seconds or faster, were solved, there remains the very great difficulty of attaching leads to very small regions of a semiconductor die, especially as to locating such regions, and because of the high affinity of semiconductor materials for dopant metals bonding alloys and lead wire materials. The time at temperature required to alloy-bond a wire to a die is generally sufficient, when the temperature produces a liquid eutectic phase, to either dissolve sufficient of the wire material to make the attachment unreliable, or to dissolve so much of the semiconductor die into the bonding alloy as to make control of die thickness very difficult. Care must be taken, especially where large volumes of bonding alloy are used, to avoid a region of thermal mismatch, having a coefficient of thermal expansion so different from that of the parent die as to cause it to break out upon thermal cycling. This thermal mismatch is well exemplified by regrown germanium crystal regions from a silver type bonding alloy. Silver as a bonding metal to germanium is a severe thermal mismatch, which causes ordinary volumes of silver alloy to break out from a germanium die upon cooling over 600° C. from the silver-germanium eutectic temperature.

Additional problems are encountered in selection of wire materials for electrical connecting wires. Eutectic forming materials such as nickel, silver, and gold tend to dissolve in large volumes into the semiconductor material at bonding temperatures. Compound forming refractory materials such as molybdenum, tantalum, platinum and tungsten, which form compounds with the semiconductor material when both are present in a solvent metal, lower their concentration in the melt by precipitation of compounds and provide a mechanism for excessive dissolution of both wire and die. This mechanism is largely mechanical, in the liquid state, being limited by transfer of dissolved wire material and dissolved semiconductor material in the liquid, to combine into a compound. Its rate of penetration of alloy material into the semiconductor die increases substantially linearly with temperature.

The foregoing difficulties have been solved by utilizing refractory metal wires for electrical connectors, and by forming double-doped alloy regrown regions by a rapid electrical pulse resistance heating to produce local high temperatures within the die sufficiently high to raise diffusion rates above bonding alloy solvent penetration rates but for times at temperature short enough to avoid substantial dissolution of the refractory metal. Refractory metals are metals of very high melting temperature which do not form low melting temperature eutectics with semiconductor materials or bonding alloys. Molybdenum, tantalum, tungsten and platinum, are generally used, although less well known elements may also fall into this class. The solvent bonding metals which may be used in the present process are those metals in which both the semiconductor material and the lead wire materials are solvent, as well as the conductivity type determining materials, or dopants. For example, for germanium semiconductor material and refractory metal wires such as molybdenum, tantalum, tungsten and platinum, nickel is a preferred solvent metal, or bonding alloy. Such a solvent metal may comprise dopant materials, which is to say that dopant materials, such as indium or aluminum, may be used as the solvent metal or carrier metals such as nickel, gold, silver, or the like may be coated with or contain dopant metals such as indium, gallium, antimony, and the like.

The solvent penetration rate, as used herein, means the rate of peneration of a die by dissolution of the semiconductor crystal into the solvent metal. Since the diffusion rates required to exceed this liquid solvent penetration rate are obtained at temperatures well above the melting temperatures of semiconductor materials, it is speculated that local melting of the semiconductor die may take place beyond such penetration of solvent, but upon cooling it retains its usual structure and properties.

It has been found that the rates of penetration of alloy liquid, or melt, into semiconductor crystals, at usual alloy bonding temperatures exceed diffusion rates of even fast diffusant materials which might otherwise be utilized to produce diffused transistor base regions from double-doped alloy regrown regions. If, however, the melt temperature is sufficiently high, the diffusion rates should exceed the liquid penetration rates because the diffusion rates increase logarithmically with temperature. Such high temperatures are in excess of the melting temperatures of most known semiconductor materials, but since semiconductor devices are generally crystalline in form, solid state diffusion has heretofore been considered to be required.

For further consideration of what is believed to be novel and our invention, attention is directed to the drawings, wherein.

Figure 1:
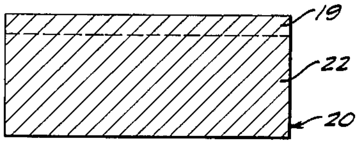
FIGURES 1 through 5 and 8 are cross-sectional views showing a semiconductor die in sequential steps of production of a transistor illustrated in FIGURE 8.
Figure 2:
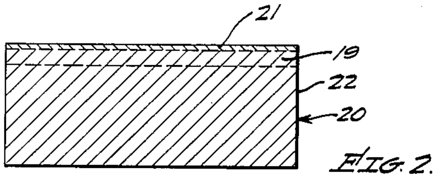
Figure 3:
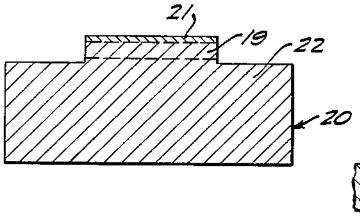
Figure 4:
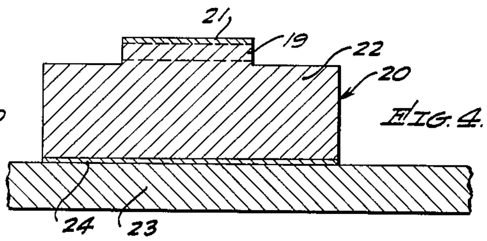
Figure 5:
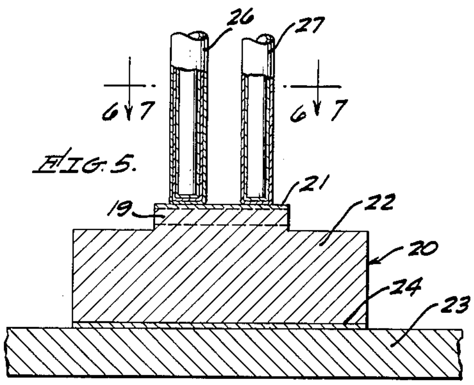

This invention is illustrated by the use of a germanium semiconductor material crystal die in producing a switching transistor of very small dimensions. As illustrated in the drawings, a P-type germanium die 20 shown in FIG. 1 has an epitaxial layer 19 of high resistivity on a body region 22 of low resistivity. The crystal 20 is subjected to diffusion of antimony in a conventional flowing gas system to expose the die surface to gaseous antimony and produce a surface-diffused region 21 about 2 to 3 microns thick of N-type as shown in FIGURE 2. A mesa is next etched onto the surface by masking a portion thereof and subjecting the balance of the surface to a suitable etchant, leaving the structure shown in FIGURE 3. A collector wire, or electrode 23 is next attached, as shown in FIGURE 4, preferably by alloy bonding as by use of a gallium doped gold bonding alloy 24 and a metal wire. (The term "wire" is used here and in the claims instead of electrical "lead" to avoid confusion with the element lead.) The bonding alloy is preferably doped with P-type conductivity type determining dopant to insure an ohmic connection; and the collector wire may be of any well known metal for such connectors.

Figure 6:
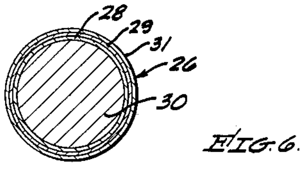
FIGURES 6 and 7 are sectional views of wires used for electrical lead attachment as shown in FIGURE 5.
Figure 7:
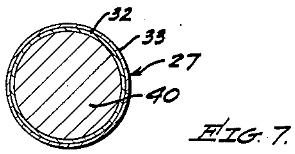

The die 20 is next assembled in contact with coated wires 26 and 27 in preparation for the main crystal doping and wire attaching operation. Wire 26, shown in section in FIGURE 6, has a core 30 of a refractory metal such as molybdenum, tantalum, platinum or tungsten, which forms compounds with germanium. Molybdenum for example, is known to form MoGe, $Mo_2Ge_3$, $Mo_3Ge_2$, and $Mo_3Ge$. These may be referred to as the $Mo_xGe_y$ series of components, or as molybdenum-germanium compounds. The wire core 30 of this example is molybdenum, coated or plated with nickel 28 as a bonding alloy, which in turn is coated with a layer 29 of antimony and a layer 31 of gallium. While the gallium and antimony may be alloyed or plated in any order, it is preferred to coat them outside the nickel to insure maximum dissolution of the dopant metals into the germanium upon heating. If these metals first are alloyed with nickel, it becomes more difficult to obtain sufficiently high gallium doping levels in the subsequently-formed emitter regrown region. The wire 27, FIGURE 7, has a mloybdenum core 40 coated with a layer 32 of nickel and a layer 33 of antimony. The dopant layers of antimony and gallium may be co-deposited with lead to lower the initial eutectic, or melting temperature.

Figure 9:
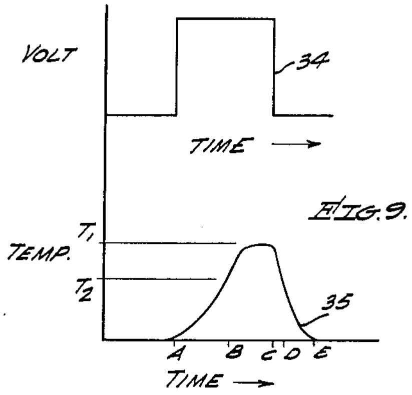
FIGURE 9 shows a heating pulse diagram of voltage and temperature against time.

In the pulse heating operation, a square-wave pulse of 50 volts substantially as shown in the voltage curve 34 of FIGURE 9 is produced in a circuit including the wire

26, a 500 ohm resistor and the die 20. This produces about 1/10 amp or about 5 watts per second for resistance heating. A temperature as shown by temperature curve 35 is produced which rises from the initial pulse time A to a maximum T at the end of the pulse time C, and falls to "cold," or room temperature, at E. The effective heating time may be considered as the time B–D above a temperature $T_2$ during which diffusion and alloying take place. In this example, a pulse of 0.1 second is used to bond the wire 26 to the crystal, to form an emitter alloy regrown P-type region 36 shown in FIGURE 8, and to form a one micron thick additional N-type antimony-diffused base region 37 substantially surrounding the region 36. The wire 26 is bonded to the crystal by a nickel rich alloy region 38.

Pulse heating times between .001 and 1.0 second are preferred, and in this example a heating time of 0.1 second with an effective liquid temperature of 1400° C. produced the desired diffused base 37 thickness of one micron. The pulse must produce sufficient heat to form a diffused base region, after cooling, of about 0.5 to 3 microns. Since germanium melts at about 936° C., it is presumed that this diffusion must take place from a liquid region before the redepostion of crystal material to form the emitter region; and it is also speculated that even the region 37, and deeper into the crystal, may momentarily melt since the experienced diffusion rates of antimony into germanium are believed to occur only at temperatures well above the melting point of germanium.

The base wire 27 is next bonded to the die 20, by a nickel-rich alloy 39, and similar pulse heating may be used to produce a diffused or alloy regrown N-type region 41 connected to the original N-type region and forming an extension thereof. The wires 26 and 27, are thus bonded by regions 38 and 39, respectively, to the die and the product is a transistor structure adaptable to high production techniques in very small configurations, and having high uniformity from transistor to transistor. In the example illustrated an emitter diameter of .001" is easily produced with the wire simultaneously attached, and very high switching speeds of the order of $10^{-8}$ seconds are attained.

Figure 8:
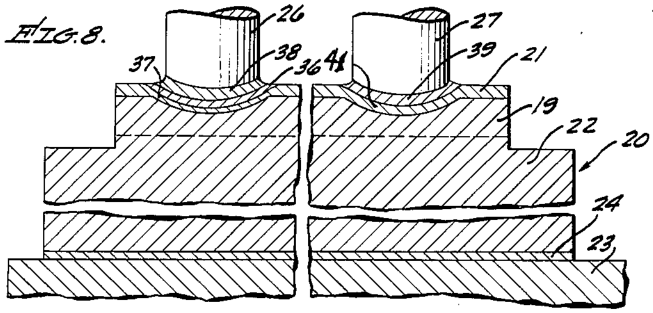

The transistor of FIGURE 8, when made as above described from germanium die material, molybdenum coated wires, nickel solvent alloy, and pulsed for 0.1 second, will show an alloy bond 38 or 39 having very little $Mo_xGe_y$ compounds, and less than 10% of the refractory wires adjacent the bonds will be dissolved. Such bonding alloy material is strong and reliable. Bonds made in such materials by general heating below the melting temperature of germanium, as for example, by heating for 30 seconds at about 770° C., will produce about 1 micron N-diffused extended base regions 37, and more than about 10% by volume of the wire ends will be dissolved and largely converted to $MO_xGe_y$ compounds. Such bonds are likely to be porous, and are generally unstable and unreliable. Minor volumes of such compounds can generally be tolerated with pulse heating times up to about 1 second, as above described, depending on the semiconductor system involved, silicon generally requiring higher temperatures than germanium.

Silicon N-P-N-type alloyed and diffused transistors may be made by the process herein disclosed, with adjustments for the special properties, especially higher melting temperatures, of silicon.

The same coated emitter electrode materials may be used to produce silicon N-P-N transistors, preferably including a greater proportion of antimony to insure the segregation balance in the emitter region 36 producing N-type material, and the base wire may be molybdenum with coatings of nickel and gallium to insure ohmic contact to the prediffused P-type surface region required for an N-P-N type silicon transistor.

It should be appreciated that in the case of germanium, segregation constants of dopant metals of groups III and V favor redeposit from a melt of P-type crystal material, while the diffusion rates in germanium greatly favor the production of N-type material. The reverse is true of the silicon semiconductor materials, and of many III–V semiconductor compound materials, including, for example, gallium arsenide. Thus the process herein disclosed is useful to produce P-N-P germanium transistors and N-P-N silicon or gallium arsenide transistors.

The above disclosed method of fast high temperature pulse bonding and post-alloy diffusion from double doped alloy material is peculiarly suitable for fast switching transistor production, but may also be used for other devices. A varactor, for example, may be produced by alloy bonding the coated wire 26 as disclosed herein to an N-type germanium die to form a graded, extended junction; and if pulse bonded to the P-type region of a PN junction die, a four layer diode may be produced in germanium. Extension of these techniques to other semiconductor materials, including those in which, like silicon, the P-type dopants are the faster diffusants, makes available a wide variety of fast switching transistors, varactor diodes and other devices with simultaneously attached leads and very thin base regions.

Having disclosed our invention, we claim:

1. A method of forming a semiconductor device which comprises:

assembling a semiconductor die, a refractory metal wire, and a solvent metal which comprises dopant material, adjacent the region of the die where the wire is to be attached;

locally heating said region and the portion of the wire thereadjacent for a time and to an effective temperature sufficient to form a liquid phase between the die and the wire having a zone comprising said dopant material and to diffuse dopant into the die beyond said zone;

and cooling said region and wire to form an alloy bond therebetween before substantial dissolution of the refractory metal of the wire.

2. A method of forming a semiconductor device which comprises:

assembling a semiconductor die, a refractory metal wire, and a solvent metal which comprises dopant material of both conductivity types adjacent the region of the die where the wire is to be attached;

locally heating said region and the portion of the wire thereadjacent for a time between .001 and 1.0 second temperature sufficient to form a liquid phase between the die and the wire having a zone containing a predominance of one of said types and to diffuse dopant of the other of said types into the die and beyond said zone;

and cooling said region and wire to form an alloy bond therebetween before substantial dissolution of the refractory metal of the wire.

3. A method of forming a semiconductor device which comprises:

assembling a semiconductor die, a refractory metal wire, and a solvent metal which comprises dopant material of both conductivity types adjacent the region of the die where the wire is to be attached;

electrically pulse heating said region and the portion of the wire thereadjacent for a time between .001 and 1.0 second and to an effective temperature sufficient to form a liquid phase between the die and the wire having a zone containing a predominance of one of said types and to diffuse dopant of the other of said types into the die and beyond said zone a distance of at least one micron;

and cooling said region and wire to form an alloy bond therebetween before substantial dissolution of the refractory metal of the wire.

4. A method of forming a semiconductor device which comprises:

assembling a semiconductor die of low resistivity having a surface layer of higher resistivity, a refractory metal wire, and a solvent metal which comprises dopant material of both conductivity types, adjacent the region of the die adjacent the surface layer;

locally heating said region and the portion of the wire thereadjacent for a time and to an effective temperature sufficient to form a liquid phase between the die and the wire having a zone containing a predominance of one of said types and to diffuse dopant of the other of said types into the die and beyond said zone;

and cooling said region and wire to form an alloy bond therebetween before substantial dissolution of the refractory metal of the wire.

5. A method of forming a semiconductor device which comprises:

assembling a semiconductor die having a surface-adjacent region which is of a first conductivity type and relatively thin and an adjacent relatively thick bulk material of a second conductivity type, a refractory metal wire, a bonding metal in which the materials of said wire and said die are solvent, and dopants of first and second types adjacent the surface of said first conductivity type region of the die;

locally heating said region adjacent said wire for a time and to an effective temperature sufficient to form a liquid phase between the die and the wire having a zone containing a predominance of said second type dopant, to dissolve a portion of the die, and to diffuse sufficient first type dopant from said zone into the die contiguous with the original first type region therein to establish an additional region of first type conductivity beyond said zone;

and cooling the assembly before a substantial portion of said wire is dissolved to form a regrown region of second conductivity type substantially bounded by said additional first conductivity type region and to bond said wire to said die.

6. A method of forming a semiconductor device which comprises:

assembling a semiconductor die having a surface-adjacent region which is of a first conductivity type and relatively thin and an adjacent bulk material of a second conductivity type, a refractory metal wire, a bonding metal in which the materials of said wire and said die are solvent, and dopants of first and second types adjacent the surface of said first conductivity type region of the die;

locally heating said region adjacent said wire for a time and to an effective temperature sufficient to form a liquid phase between the die and the wire having a zone containing a predominance of said second type dopant to dissolve a portion of the die, and to diffuse first type dopant from said zone into the die contiguous with the original first type region therein at a faster rate than that of liquid penetration to establish an additional region of first type conductivity;

cooling the assembly before the liquid dissolves over 10% of the volume of said wire metal adjacent the die to form a regrown region of second conductivity type substantially bounded by said additional first conductivity type region and to bond said wire to said die.

7. A method of forming a semiconductor device which comprises:

assembling a semiconductor die having a surface adjacent region which is of a first conductivity type and relatively thin and an adjacent bulk material of a second conductivity type, a refractory metal wire, a bonding metal in which the materials of said wire and said die are solvent, and dopants of first and second types adjacent the surface of said first conductivity type region of the die;

locally heating said region adjacent said wire for a time and to an effective temperature sufficient to form a liquid phase between the die and the wire having a zone containing a predominance of second type dopant, to dissolve a portion of the die, and to diffuse first type dopant from said zone into the die to form an additional first type region contiguous with the original first type region therein of at least one micron thickness;

cooling the assembly before said liquid dissolves over 10% of the volume of wire metal adjacent the die, to form a regrown region of second conductivity type substantially bounded by said additional first conductivity type region, and to bond said wire to said die;

and ohmically connecting a second wire to said surface adjacent region.

8. A method of forming a semiconductor device which comprises:

assembling a semiconductor die having a surface adjacent region which is of a first conductivity type and relatively thin and an adjacent bulk material of a second conductivity type, a refractory metal wire, a bonding metal in which the materials of said wire and said die are solvent coated on the wire, and dopants of first and second types adjacent the surface of said first conductivity type region of the die;

locally heating said region adjacent said wire for a time between .001 second and 1 second and to an effective temperature sufficient to form a liquid phase between the die and the wire having a zone containing a predominance of said second type dopant, dissolve a portion of the die, diffuse sufficient first type dopant into the die from said zone contiguous with the original first type region therein to establish an additional region of first type conductivity of at least one micron thickness;

cooling the assembly before said liquid dissolves over 10% of the volume of wire metal adjacent the die, to form a regrown region of second conductivity type substantially bounded by said additional first conductivity type region, and to bond said wire to said die;

ohmically connecting a second wire to said surface adjacent region; and ohmically connecting a third wire to said bulk material.

9. A method of forming a semiconductor device which comprises:

assembling a germanium semiconductor crystal of predominantly P-type conductivity type and having a surface adjacent region of N-conductivity type, a wire of refractory metal of the class consisting of molybdenum, tungsten, platinum, tantalum, and a solvent metal which momprises N and P-type dopants adjacent the surface of said N-type region;

heating said assembly for an effective time less than one second and sufficient to locally heat said wire and die to an effective temperature in excess of 1400° C. to form a liquid phase between the die and the wire having a zone containing a predominance of P-type dopant and diffuse therefrom sufficient N-type dopant to establish an additional region at least one micron thick of N-conductivity type in the die; and cooling the liquid phase to form a regrown crystal region of P-type from said zone and to bond the wire to the crystal before substantial dissolution of the refractory metal of the wire.

10. A method of forming a semiconductor device which comprises:

assembling a germanium semiconductor crystal of predominantly P-type conductivity type and having a surface adjacent region of N-conductivity type, a wire of refractory metal of the class consisting of molybdenum, tungsten, chromium, tantalum, and a solvent metal which comprises N and P-type dopants in electrical contact with the surface of said N-type region;

electrically pulse heating said assembly by passing an electrical pulse between said wire and said N-type die region for an effective time less than 1 second and sufficient to locally heat said wire and die to an effective temperature in excess of 1400° C. to form a liquid phase between the die and the wire containing a zone of P-type and diffuse therefrom sufficient N-type dopant to establish an additional region of N-conductivity type in the die;

cooling the liquid phase to form a regrown crystal region of P-type from said zone and to bond the wire to the crystal before substantial dissolution of the refractory metal of the wire.

11. A method of forming a semiconductor device which comprises:

assembling a germanium semiconductor crystal of predominantly P-type conductivity type and having a surface adjacent region of N-conductivity type, a wire of refractory metal, a solvent metal coated on said wire, and N and P-type dopants coated on the solvent metal coating in electrical contact with the surface of said N-type region;

electrically pulse heating said assembly by passing an electrical pulse between said wire and said N-type die region for an effective time less than 1 second and sufficient to locally heat said wire and die to an effective temperature in excess of 1400° C. to form a liquid phase between the die and the wire containing a zone of P-type and diffuse therefrom sufficient N-type dopant to establish an additional region of N-conductivity type in the die; and cooling the liquid phase to form a regrown crystal region of P-type from said zone and to bond the wire to the crystal before substantial dissolution of the refractory metal of the wire.

12. A method of forming a semiconductor device which comprises:

assembling a germanium semiconductor crystal of predominantly P-type conductivity type and having a surface adjacent region of N-conductivity type, a wire of molybdenum metal, a coating of nickel on said wire, and coatings of gallium and antimony on said nickel coating in electrical contact with the surface of said N-type region;

electrically pulse heating said assembly by passing an electrical pulse between said wire and said N-type die region for an effective time less than 1 second and sufficient to locally heat said wire and die to an effective temperature in excess of 1400° C. to form a liquid phase between the die and the wire containing a zone of P-type and diffuse therefrom sufficient antimony to establish an additional region of N-conductivity type in the adjacent portion of the die; and cooling the liquid phase to form a regrown gallium-rich crystal region of P-type from said zone and to bond the wire to the crystal before substantial dissolution of the refractory metal of the wire.

13. A semiconductor device comprising:

a semiconductor die;

a refractory metal wire;

a solvent type bonding alloy bonding said wire to said die;

a regrown region of semiconductor material of one type in said die adjacent said bonding alloy;

a diffused region of opposite conductivity type of substantially uniform and less than 5 microns thickness adjacent at least a portion of said regrown region; and a bulk die region of the same conductivity type as said regrown region and separated therefrom by material of said diffused region of opposite conductivity type.

14. A semiconductor device comprising:
a semiconductor die;
a refractory metal wire of the class consisting of molybdenum, tantalum, tungsten and platinum;
a solvent type bonding alloy bonding said wire to said die;
a regrown region of semiconductor material of one type in said die adjacent said bonding alloy;
a diffused region of opposite conductivity type of substantially uniform and less than 5 microns thickness adjacent at least a portion of said regrown region;
a bulk die region of the same conductivity type as said regrown region and separated therefrom by material of said diffused region of opposite conductivity type; and
a second wire ohmically attached to said bulk die region.

15. A semiconductor device comprising:
a germanium semiconductor die;
a molybdenum wire;
a nickel bonding alloy bonding said wire to said die;
a regrown region of semiconductor material of P-type in said die adjacent said bonding alloy;
a diffused region of N-type of substantially uniform and less than 5 microns thickness adjacent at least a portion of said P region; and
a bulk die region of P-type and separated from said regrown region by material of said diffused region of N-type.

16. A semiconductor device comprising:
a semiconductor die having a bulk region of one conductivity type and a surface adjacent region of opposite type;
a refractory metal wire;
a solvent type bonding alloy bonding said wire to said die;
a regrown region of semiconductor material of one type in said die adjacent said bonding alloy;
a diffused region of opposite conductivity type of substantially uniform and less than 5 microns thickness adjacent at least a portion of said region and forming an extension of said surface-adjacent region, the bulk die region of the same conductivity type as said regrown region being separated therefrom by material of said diffused region of opposite conductivity type;
a wire ohmically attached to said surface adjacent region; and
a wire ohmically attached to said bulk die region.

References Cited by the Examiner

UNITED STATES PATENTS

| | | | |
|---|---|---|---|
| 2,847,623 | 8/58 | Thornhill | 148—1.5 |
| 2,861,230 | 11/58 | LeLoup | 148—1.5 |
| 2,989,578 | 6/61 | Wagner | 148—1.5 |
| 3,074,826 | 1/63 | Tummers | 148—185 |

DAVID L. RECK, *Primary Examiner.*

WINSTON A. DOUGLAS, HYLAND BIZOT, *Examiners.*